Figure 1:
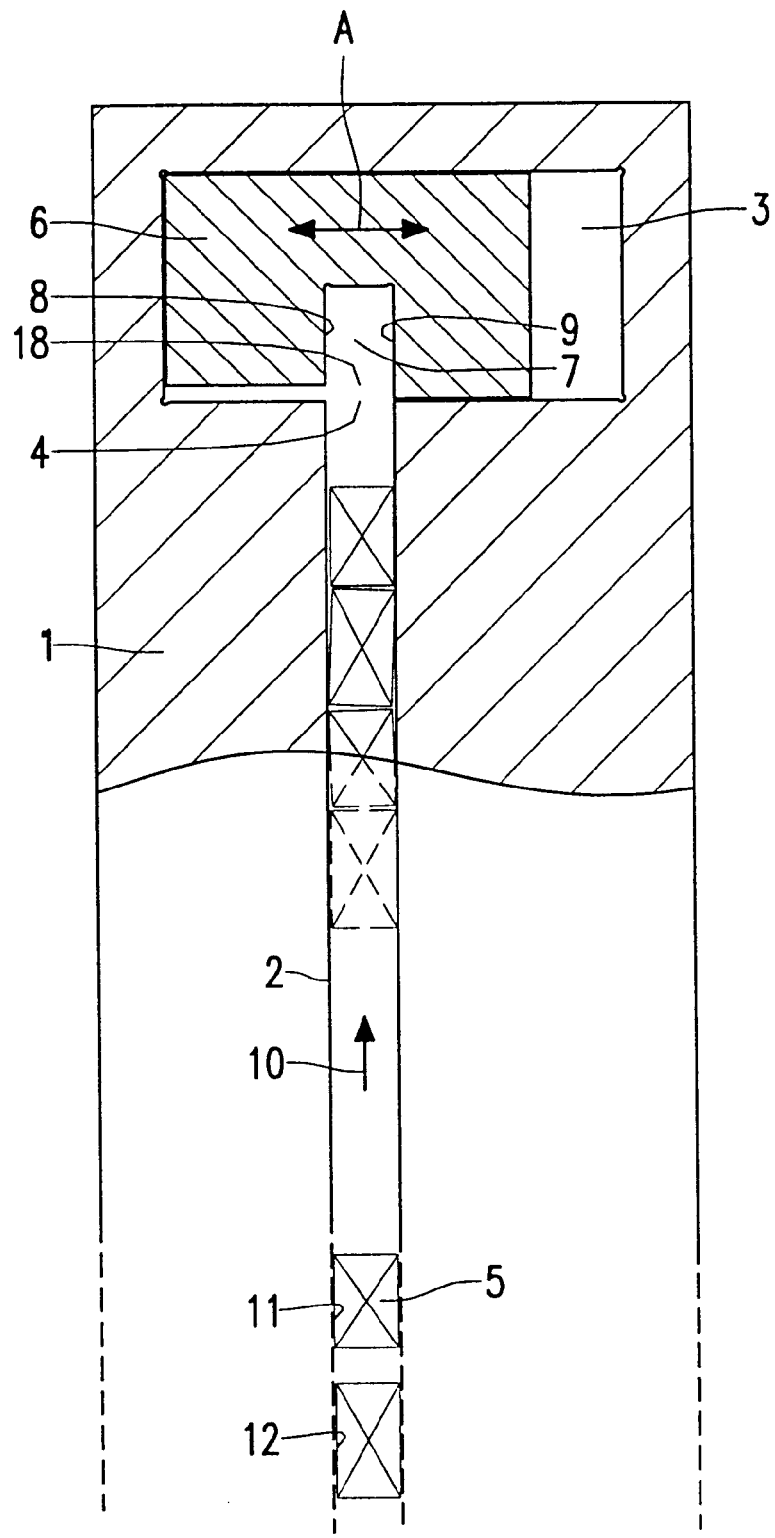

United States Patent
Vroomans

[11] Patent Number: 5,950,801
[45] Date of Patent: Sep. 14, 1999

[54] SEPARATION DEVICE FOR SEPARATING A FIRST COMPONENT FROM A ROW OF COMPONENTS

[75] Inventor: Christianes A.G. Vroomans, Eindhoven, Netherlands

[73] Assignee: U.S. Philips Corporation, New York, N.Y.

[21] Appl. No.: 08/975,426

[22] Filed: Nov. 20, 1997

[30] Foreign Application Priority Data

Nov. 28, 1996 [EP] European Pat. Off. .............. 96203370

[51] Int. Cl.⁶ .................................................. B65G 47/44
[52] U.S. Cl. ................................. 198/468.11; 198/468.9; 198/463.4
[58] Field of Search .............................. 198/463.4, 468.9, 198/468.11

[56] References Cited

U.S. PATENT DOCUMENTS 3,548,998 12/1970 Heller ..................................... 198/468.9
3,972,408 8/1976 Seragnoli .............................. 198/468.9

Primary Examiner—William E. Terrell
Assistant Examiner—Mark Deuble
Attorney, Agent, or Firm—Anne E. Barschall

[57] ABSTRACT

A separation device for separating a first component (5a) from a row of components disposed in a supply duct (2) by means of a separation member (6) disposed after an outlet (4) of the supply duct, which separation member (6) has a recess (7) for receiving the first component (5a) of the row, which recess has side walls (8, 9) oriented in a longitudinal direction (10) of the supply duct (2) and between which a component of the row of components is engageable. In order to ensure a trouble-free separation of the components, a length of one of the side walls (8) is equal to a minimum component length (11) and a length of the other side wall is equal a maximum component length (12). When the first component (5a) has engaged the separation member (6), the separation member is moved transversely to the longitudinal direction of the supply duct (2) in a direction from the shorter side wall (8) to the longer side wall (9).

4 Claims, 4 Drawing Sheets

SEPARATION DEVICE FOR SEPARATING A FIRST COMPONENT FROM A ROW OF COMPONENTS

The invention relates to a separation device for separating a first component from a row of components, the device comprising a supply duct for receiving a row of components disposed in line with one another, a separation member disposed after an outlet of the supply duct, which separation member has a recess for receiving the first component of the row, which recess has side walls oriented in the longitudinal direction of the duct and between which the component is engageable, and which separation member is movable in a direction transverse to the longitudinal direction of the duct.

Such a separation device is known from EP-B1-0 484 224 and is used for separating components, such as SMDs (Surface Mounted Devices), arranged in line in a row, one by one from the row. When a component has been separated it can readily be picked up, for example by a placement head of a component placement machine, in order to be placed onto a printed circuit board. The separation member of the separation device in accordance with EP-B1-0 484 224 has a groove to facilitate engagement of a component in the recess of the separation member.

It is an object of the invention to improve the separation device as defined in the opening paragraph in such a manner that a substantially faultless separation of the first component of a row of components is achieved, allowance being made for the tolerance in the length of a component.

To this end, the separation device in accordance with the invention is characterized in that one of said side walls of the recess is shorter than the facing other side wall, in such a manner that the length of the shorter side wall is smaller than a minimum component length, and the length of the longer side wall is greater than a maximum component length, and the separation member, after having received a component in the recess, is movable in a direction from the shorter side wall to the longer side wall. After a component has engaged the recess the trailing end of the component, situated adjacent the second component in the row, is always disposed between the front corner point of the long side wall and the front corner point of the short side wall. As a result of this, the separation member can readily be slid away or swung away in a direction transverse to the longitudinal direction of the row of components in order to sever the first component from the second component.

When the first component enters the recess it may happen that the component abuts against an edge of the inlet of the recess and becomes stuck, as a result of which the separation member is blocked. In order to minimize the likelihood of this, a preferred embodiment is characterized in that the separation device comprises a plate-shaped body in which the supply duct is situated, which body has a guide wall near the outlet of the duct, at opposite sides of the duct, which guide walls extend both transversely to the side walls, the guide walls of the separation member adjoining the respective guide walls of the plate-shaped body. When a component engages in the recess the corner points of the edges of the outlet of the supply duct and the corner points of the edges of the inlet of the recess are disposed exactly in line with one another, so that a component engages the recess without any problem. Moreover, the edges at the inlet of the recess can be bevelled in order to ensure that the component engages the recess without any problems.

Figure 4:
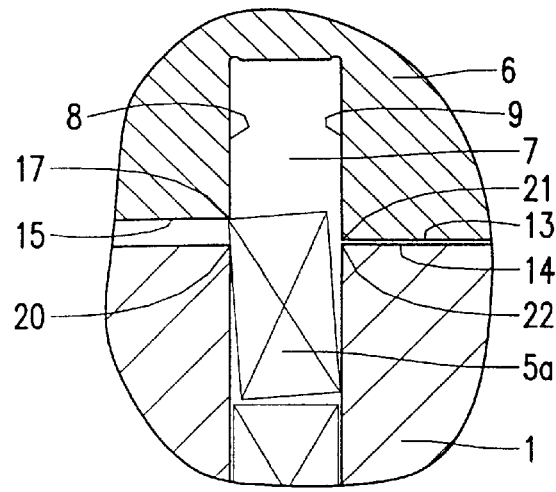
Figure 5A:
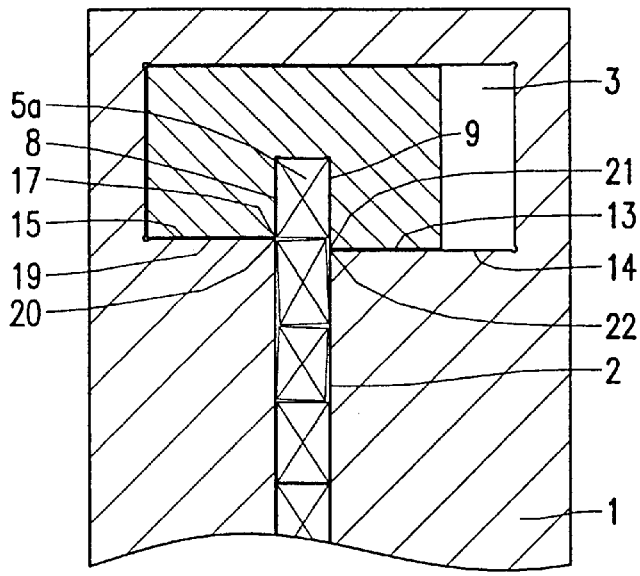
Figure 5B:
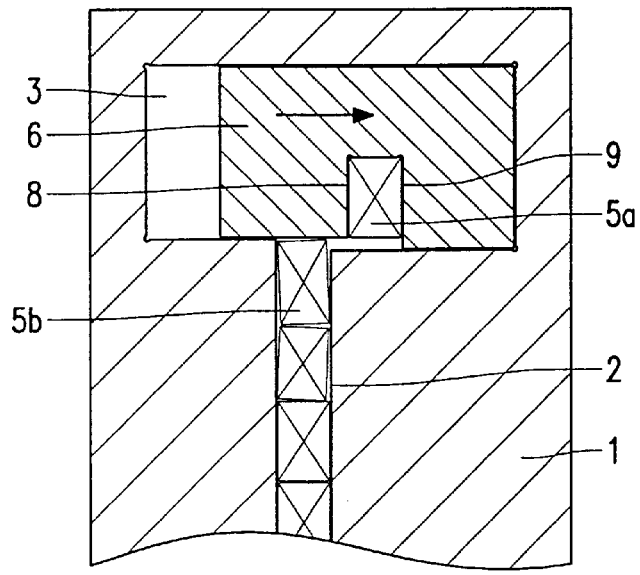
Figure 6:
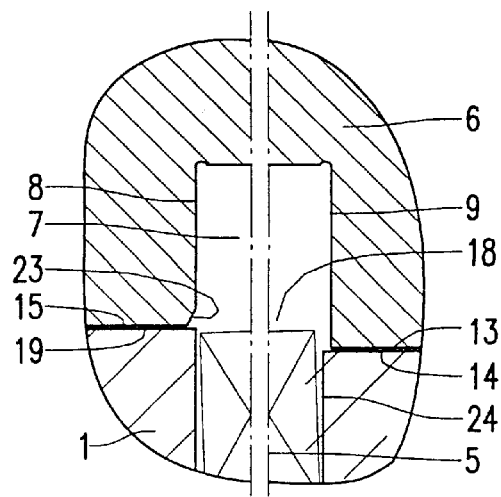

The invention will now be described in more detail with reference to an embodiment shown in diagrammatic drawings. In the drawings FIG. 1 shows a separation device, FIGS. 2a–2b show the separation device of FIG. 1 while a component of a minimum length is separated, FIGS. 3a–3b show the separation device of FIG. 1 while a component of maximum length is separated, FIG. 4 shows a part of the separation device of FIG. 1 with a canted component to an enlarged scale, FIGS. 5a–5b show a variant of the separation device of FIG. 1, and FIG. 6 show a modification of the separation device of FIG. 5a.

Figure 2A:
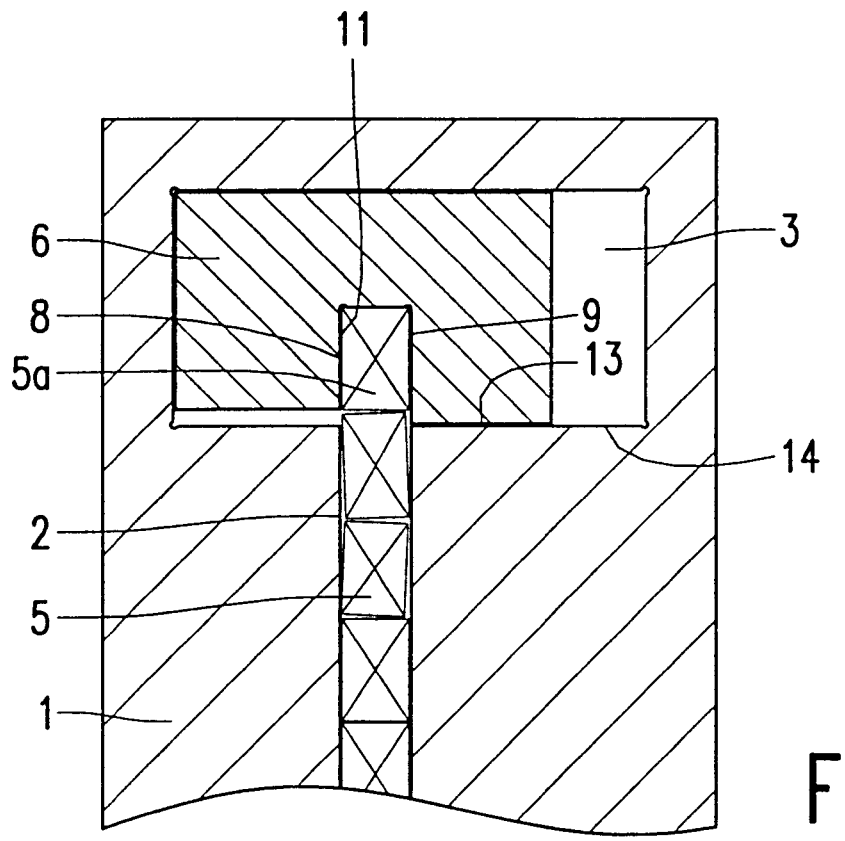
Figure 2B:
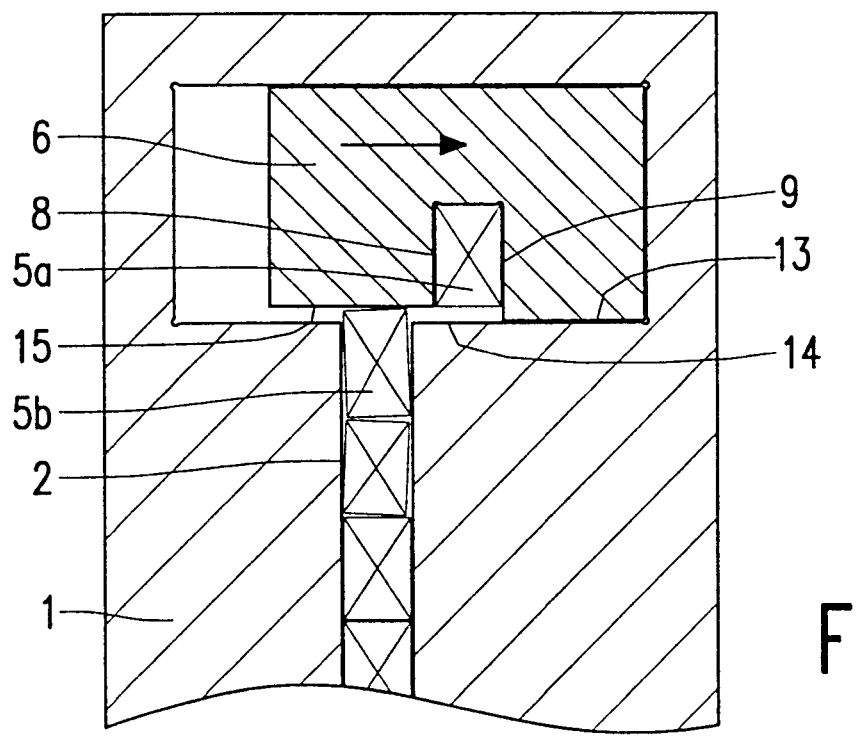

The separation device as shown in FIG. 1 has a plate-shaped body having a supply duct 2 for components and a window-like opening 3. The supply duct terminates in the opening 3 near the outlet 4 of the duct. The supply duct is filled with components 5 by means of, for example, a bulk feeder, not shown. A separation member 6 in the form of a rectangular plate is disposed in the opening 3 and has a recess 7 for receiving a component 5. The separation member can be slid to and fro in the opening 3 transversely to the longitudinal direction of the duct, as indicated by an arrow A, by means of a drive mechanism, not shown. The side walls 8 and 9 of the recess extend in the longitudinal direction 10 of the supply duct 2. The side wall 8 is shorter than the side wall 9. Components of a given type have dimensions within a given tolerance. Thus, viewed in the longitudinal direction in which they are moved in the supply duct, components have a minimum dimension and a maximum dimension. In FIG. 1 the minimum component length bears the reference numeral 11 and the maximum component length bears the reference numeral 12. In accordance with the invention the length of the short side wall 8 is at the most equal to the minimum component length 11 and the length of the long side wall 9 is at least equal to the maximum component length 12.

The separation device operates as follows (see FIGS. 2a–2b). In FIG. 2a the separation member 6 is situated at the left-hand side in the opening 3, the recess 7 being disposed in line with the supply duct 2. By means of compressed-air impulses the components 5 are fed through the supply duct 2 until the first component 5a of the row enters the recess. In FIGS. 2a–2b the first component 5a has a maximum length 11. Subsequently, the separation member 6 is moved to the right, i.e. in a direction from the short side wall 8 to the long side wall 9 (FIG. 2b). The guide wall 13 of the separation member 6 then slides along the guide wall 14 of the opening 3. The wall 15 of the separation member moves just past the front side of the second component 5b. The first component 5a is now severed from the other components and can be picked up by a pick-up device, for example a suction nozzle of a placement head of a component placement machine, for example in order to be placed onto a printed circuit board. This picking up is not shown but is effected in a direction perpendicular to the plane of drawing. Subsequently, the empty separation member 6 is moved back to the left to receive the next component.

Figure 3A:
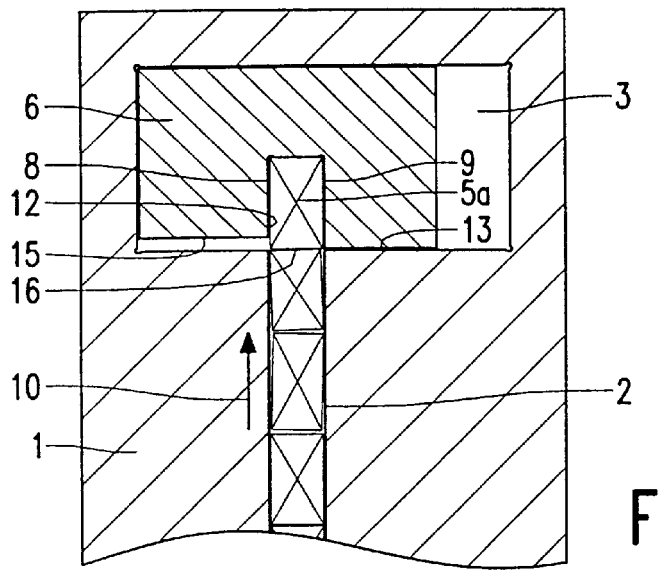
Figure 3B:
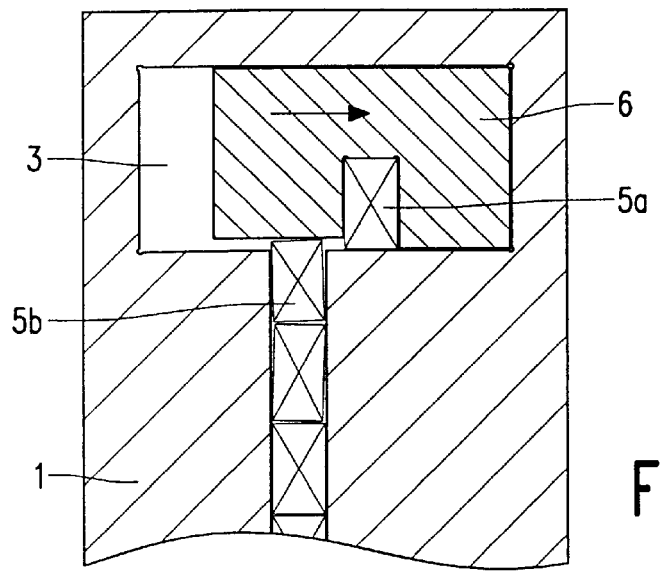

FIGS. 3a–3b show the situation for a component having a maxim length 12. The operation is basically as described above. As is apparent from FIGS. 2a–2b and 3a–3b the end 16 of the first component 5a, which end faces the second component 5b, is always disposed between the walls 13 and 15 of the separation member 6. Viewed in the longitudinal direction 10 of the supply duct there is a step between the walls 13 and 16, which step corresponds to the difference in length between the side walls 8 and 9.

The components also have a certain tolerance in the width direction. When a component 5 is advanced in the supply duct 2 it is possible that a first component 5a in the row becomes slightly canted, as a result of which it abuts against a corner point 17 of the side wall 8 of the separation member at the inlet 18 of the recess and is obstructed (FIG. 4). In order to preclude or at least minimize the likelihood of such an obstruction the wall 15 of the separation member 6 has also been constructed as a guide wall in order to cooperate with a guide wall 19 of the opening 3 (see FIGS. 5a–5b). Viewed in the longitudinal direction of the supply duct there is another step between the guide walls 14 and 19 of the opening 3 of the plate 1, which step also corresponds to the difference in length between the side walls 8 and 9 of the recess 7. When the separation member is in its left-hand position in the opening 3, the corner point 17 of the recess is exactly aligned with the corner point 20 of the end of the supply duct. This also applies to the corner points 21 and 22. When the first component Sa is moved forward in the recess 7 the risk that a slightly canted component abuts against the corner point 17 or 21 of the recess is substantially nil.

FIG. 6 shows a part of an embodiment in which the side walls 8 or 9 near the inlet 18 of the recess has a bevelled edge 23 (at the left in the FIG. 6). It is also possible to dimension the recess 7 of the separation member 6 in such a manner that the wall 9 of the recess 7 recedes with respect to a corresponding wall 24 of the duct 2 during engagement of the component 5 into the recess (at the right in the Figure). These measures also assist in a trouble-free separation of the first component of the row.

The separation device in accordance with the invention is very suitable for use in the supply of small components from a bulk feeder to a component placement machine, but for example also to an in-tape machine.

I claim:

1. A separation device for separating a first component from a row of components, the device comprising a supply duct for delivering a row of components disposed in line with one another to an outlet, said components having a minimum componnent length and a maximum component length, a separation member disposed after an outlet of the supply duct, which separation member has a recess for receiving the first component of the row, which recess has side walls oriented in the longitudinal direction of the duct and between which the component is engageable, and which separation member is movable in a direction transverse to the longitudinal direction of the duct, characterized in that one of said side walls of the recess is shorter than the facing other side wall, in such a manner that the length of the shorter side wall is smaller than a minimum component length, and the length of the longer side wall is greater than a maximum component length, and the separation member, after having received a component in the recess, is movable in a direction from the shorter side wall to the longer side wall.

2. A separation device as claimed in claim 1, wherein the separation device comprises a plate-shaped body in which the supply duct is situated, which body has guide walls positioned near the outlet of the duct, at opposite sides of the duct, which guide walls extend transversely to the side walls, the side walls of the separation member adjoining the guide walls of the plate-shaped body.

3. A separation device as claimed in claim 1, characterized in that the edges of the inlet of the recess of the separation member are bevelled.

4. A separation device as claimed in claim 2, characterized in that the edges of the inlet of the recess of the separation member are bevelled.

* * * * *